United States Patent
Dangler et al.

(10) Patent No.: US 7,921,403 B2
(45) Date of Patent: Apr. 5, 2011

(54) CONTROLLING IMPEDANCE AND THICKNESS VARIATIONS FOR MULTILAYER ELECTRONIC STRUCTURES

(75) Inventors: John Richard Dangler, Rochester, MN (US); Matthew Stephen Doyle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 12/101,455

(22) Filed: Apr. 11, 2008

(65) Prior Publication Data

US 2009/0255713 A1 Oct. 15, 2009

(51) Int. Cl.
*G06F 17/50* (2006.01)
*H03K 17/693* (2006.01)
*H05K 1/00* (2006.01)
*H05K 1/09* (2006.01)

(52) U.S. Cl. ........ 716/137; 716/100; 716/101; 716/132; 716/136; 174/250; 174/251; 174/254

(58) Field of Classification Search .................. 716/1, 4, 716/5, 15; 174/250, 251, 254, 262, 264; 435/4, 6, 173.1
See application file for complete search history.

(56) References Cited

U.S. PATENT DOCUMENTS

| | | | | |
|---|---|---|---|---|
| 5,262,590 A * | 11/1993 | Lia | | 174/36 |
| 5,369,219 A * | 11/1994 | Kerns | | 174/250 |
| 5,480,841 A | 1/1996 | Bickford et al. | | |
| 5,640,699 A * | 6/1997 | Ralph | | 455/326 |
| 5,719,749 A * | 2/1998 | Stopperan | | 361/769 |
| 6,111,756 A * | 8/2000 | Moresco | | 361/735 |
| 6,205,654 B1 * | 3/2001 | Burns | | 29/830 |
| 6,395,480 B1 * | 5/2002 | Hefti | | 435/6 |
| 6,555,745 B1 * | 4/2003 | Kruse et al. | | 174/394 |
| 6,788,073 B2 * | 9/2004 | Wallace et al. | | 324/642 |
| 6,800,169 B2 * | 10/2004 | Liu et al. | | 156/292 |
| 7,192,752 B2 * | 3/2007 | Xu et al. | | 435/173.1 |
| 7,239,013 B2 | 7/2007 | Shimada et al. | | |
| 7,249,337 B2 * | 7/2007 | Gisin et al. | | 716/15 |
| 7,439,449 B1 * | 10/2008 | Kumar et al. | | 174/254 |
| 7,524,194 B2 | 4/2009 | Eldridge et al. | | |
| 7,531,751 B2 * | 5/2009 | Hosomi et al. | | 174/250 |
| 7,589,283 B2 * | 9/2009 | Danoski et al. | | 174/260 |
| 7,592,250 B2 | 9/2009 | Shimada et al. | | |
| 7,626,216 B2 * | 12/2009 | McKinzie | | 257/192 |
| 7,696,442 B2 | 4/2010 | Muramatsu et al. | | |
| 7,703,201 B2 | 4/2010 | Oggioni et al. | | |
| 2006/0121446 A1 * | 6/2006 | Abassi et al. | | 435/4 |

(Continued)

OTHER PUBLICATIONS

Goto et al.; "Electrical design optimization and characterization in Cell Broadband Engine package"; Publication Year: 2006; Electronic Components and Technology Conference, 2006. Proceedings. 56th.*

(Continued)

*Primary Examiner* — Helen Rossoshek
(74) *Attorney, Agent, or Firm* — Matthew C. Zehrer

(57) ABSTRACT

Impedance control, and the uniformity of electrical and mechanical characteristics in electronic packaging are becoming more important as chip and bus speeds increase and manufacturing processes evolve. Current state of the art design and manufacture processes inherently introduce physical dielectric thickness variations into PCB cross sections. These thickness variations between the ground reference plane(s) and the signal layer(s) inject undesirable characteristic impedance variations and undesirable mechanical variations in thickness and surface topology. Therefore a process of generating equalization data and a design structure for multilayer electronic structures is presented.

11 Claims, 15 Drawing Sheets

U.S. PATENT DOCUMENTS

| | | |
|---|---|---|
| 2007/0039171 A1* | 2/2007 | Goergen .......................... 29/825 |
| 2007/0066126 A1 | 3/2007 | Dutta et al. |
| 2009/0107710 A1 | 4/2009 | Goergen |
| 2009/0158581 A1* | 6/2009 | Nguyen et al. ................ 29/592.1 |
| 2009/0223710 A1* | 9/2009 | Becker et al. .................. 174/264 |
| 2009/0255713 A1 | 10/2009 | Dangler et al. |
| 2009/0255715 A1* | 10/2009 | Dangler et al. ................ 174/251 |
| 2009/0258194 A1* | 10/2009 | Dangler et al. ................ 428/174 |
| 2010/0180437 A1 | 7/2010 | McKinzie, III |

OTHER PUBLICATIONS

Swirbel et al.; "Electrical design and simulation of high density printed circuit boards"; Publication Year: 1999; Advanced Packaging, IEEE Transactions on; vol. 22, Issue: 3; pp. 416-423.*

* cited by examiner

CONTROLLING IMPEDANCE AND THICKNESS VARIATIONS FOR MULTILAYER ELECTRONIC STRUCTURES

CROSS REFERENCE TO RELATED APPLICATIONS

The present application is related to the following U.S. patent applications, which are hereby incorporated by reference herein in their entirety:

U.S. patent application Ser. No. 12/101,441, filed herewith titled "Controlling Impedance and Thickness Variations for Multilayer Electronic Structures".

U.S. patent application Ser. No. 12/101,449, filed herewith titled "Controlling Impedance and Thickness Variations for Multilayer Electronic Structures".

BACKGROUND

FIGS. 1A-1C illustrate the current state of the art in developing at least one type of multilayer electronic structure. A core consists of at least one layer of copper (used as a reference ground layer), a layer of bonding film (e.g., FR4, etc.), and a second layer of copper. Selected locations of the second layer of copper are removed (e.g., etched), leaving intact copper signal traces that provide for the internal circuitry of the multilayer electronic structure. Bonding film is laminated between a first core and a second core to provide a continuous multilayer structure. When signal trace density changes (i.e., in a first location on the core there are numerous signal traces, and in a second location there are very few, if any, signal traces,) the distance from the signal traces to the reference ground layer varies across the multilayer electronic structure. This variation of distance results in variations in mechanical thickness, impedance, and electrical performance.

For example see FIG. 1A. FIG. 1A depicts a prior art multilayer electronic structure having a single isolated signal trace. For instance if the signal trace is 4 mils wide, 0.7 mils thick, and the bonding film is 4 mils thick, after lamination the distance from the top of the signal trace to the adjacent reference ground layer approaches 3.3 mils.

Alternatively see FIG. 1B. FIG. 1B depicts a prior art multilayer electronic structure having a signal trace nestled between two wide traces (e.g., power signal trace, ground signal trace, etc.). For instance if the signal trace is 4 mils wide, 0.7 mils thick, and the bonding film is 4 mils thick, after lamination the distance from the top of the signal trace to the adjacent reference ground layer approaches 4.0 mils.

Alternatively see FIG. 1C. FIG. 1C depicts a prior art multilayer electronic structure having a single trace nestled between two other signal traces. For instance if each signal trace is 4 mils wide, 0.7 mils thick, and the bonding film is 4 mils thick, after lamination the distance from the top of the signal traces to the adjacent reference ground layer approaches 3.65 mils.

In the examples depicted in FIGS. 1A, 1B, and 1C, the distance from the top of the signal traces to the adjacent reference ground layer by itself leads to impedance differences of 48-51-53 Ohms respectively.

In the current state of the art, impedance and mechanical (i.e., thickness) tolerance requirements are tight and may in fact become tighter. Currently impedance tolerances of +/−10% are typical (e.g., 50 Ohms +/−5 Ohms). In the future, impedance tolerances of +/−7.5% or 5.0% may become more common. In the examples depicted in FIGS. 1A, 1B, and 1C, 50% of the +/−10.0% tolerance is taken up by the effect of the distance variations from the top of the signal trace to the adjacent reference ground layer.

SUMMARY

The present invention generally relates to multilayer electronic structures (i.e., printed circuit board (PCB), microstrip, coplanar PCB, stripline, ect., or any such equivalent multilayer structures.), method(s), and design structure(s) relating to the multilayer electronic structures.

Herein the terms multilayer electronic structure, printed circuit board, PCB, microstrip, etc. may be used interchangeably.

Impedance control, and the uniformity of electrical and mechanical characteristics in electronic packaging are becoming more important as chip and bus speeds increase and manufacturing processes evolve. Current state of the art design and manufacture processes inherently introduce physical dielectric thickness variations into PCB cross sections. These thickness variations between the ground reference plane(s) and the signal layer(s) inject undesirable characteristic impedance variations and undesirable mechanical variations in thickness and surface topology.

In an embodiment of the present invention characteristic impedance variations due to non uniformity in both signal density and dielectric bonding film thickness are improved. In other words, the cross section thickness across the entire electronic multilayer structure is more uniform.

In another embodiment a method of multilayer electronic structure manufacture comprises removing material of a dielectric layer, and laminating the dielectric layer to a core, wherein the material of the dielectric layer is removed in locations such that when the dielectric layer is laminated to the core the locations having material removed correspond to the locations upon the core having signal traces. In other words the dielectric layer is removed only in locations that mirror signal trace locations. In another embodiment the amount of dielectric material removed is proportional to the density of signal traces upon the core. In another embodiment the volume of removed dielectric material is approximately equal to the volume of the signal traces.

In another embodiment the method of multilayer electronic structure manufacture further comprises determining an optimum impedance, and adjusting the amount of dielectric material to be removed based on the optimum impedance. In another embodiment the method of multilayer electronic structure manufacture further comprises determining an optimum via size or via density, and adjusting the amount of dielectric material to be removed based on the via size or via density. In the present embodiment via size or via density relates to a via that is electrically contacting/formed to a signal trace.

In another embodiment a method of multilayer electronic structure manufacture comprises: providing a dielectric layer; selectively removing material of the dielectric layer resulting in at least a first section of the dielectric having had material removed, and a original section of the dielectric not having had material removed; positioning the dielectric layer versus a core such that the first section corresponds to a location of the core having at least one signal trace thereupon. In another embodiment the volume of characterized fill is approximately equal to the volume of signal trace material that is removed in the signal trace creation process.

In another embodiment the method of multilayer electronic structure manufacture further comprises: determining an optimum impedance and adjusting the amount of characterized fill to be add based on the optimum impedance. In another embodiment the optimum impedance at least in part relates to via size and/or via density.

In another embodiment a multilayer electronic structure comprises a dielectric layer having at least a displaced section of the dielectric layer having had material removed and a original section of the dielectric layer not having had material removed, and; a core layer having at least one signal trace thereupon; wherein when the dielectric is positioned versus the core layer the displaced section corresponds to a location of the core having at least one signal trace thereupon.

In another embodiment the removed location corresponds to the location of the at least one signal trace after the dielectric layer is laminated to the core layer. In another embodiment the amount of dielectric material removed is proportional to the volume of the at least one signal trace. In another embodiment the amount of dielectric material removed is approximately equal to the volume of the at least one signal trace. In another embodiment the volume of the at least one signal trace at least in part relates to an optimum impedance. In another embodiment the optimum impedance at least in part relates to signal trace geometry.

In another embodiment a multilayer electronic structure comprises a dielectric layer, a core layer having at least a first location with at least one signal trace thereupon, and a second location with no signal traces thereupon, and a characterized fill layer applied upon the second location. In another embodiment the amount of characterized fill applied is inversely proportional to the volume of the at least one signal trace. In another embodiment the amount of characterized fill applied is approximately equal to a volume equal to the area of the second group multiplied by the height of the at least one signal trace. In another embodiment the amount of characterized fill applied is based on an optimum impedance. In another embodiment the optimum impedance at least in part relates to via geometry.

In a particular embodiment a process of generating equalization data used to equalize thickness and/or impedance variations in multilayer electronic structure is described. The process comprises providing for the design of a multilayer electronic structure on a computer aided design package, generating finite element cells upon at least one layer of the multilayer electronic structure, calculating the signal trace density of each finite element cell, and generating equalization data. In another embodiment the equalization data is provided, for example, to a PCB card or other multilayer electronic structure manufacturer.

In another embodiment equalization data is generated/determined by identifying a baseline finite element cell having a baseline signal trace density, comparing the baseline signal trace density against an another signal trace density of an another cell, generating equalization data if the difference in the baseline signal trace density and the another signal trace density exceeds a maximum signal trace density value.

In another embodiment the equalization data provides the location and the amount of bonding film material to be removed. In another embodiment the equalization data provides the location and the amount of characterized fill to be added upon a layer of the multilayer electronic structure having signal traces thereupon. In another embodiment the equalization data is arranged into an equalization data matrix, thereby providing equalization data for the entire printed circuit card, and provided to, for example a PCB card or other multilayer electronic structure manufacturer.

In another embodiment the equalization data is generated/determined by identifying a baseline finite element cell having a baseline impedance, comparing the baseline impedance against another impedance of another cell, and generating equalization data if the difference in the baseline impedance and the another impedance exceeds a maximum impedance. In another embodiment the equalization data provides the location and the amount of dielectric material to be removed. In another embodiment the equalization data provides the location and the amount of characterized fill to be added upon a layer of the multilayer electronic structure having signal traces thereupon.

In another embodiment the equalization data is generated/determined by identifying a baseline finite element cell having a baseline thickness, comparing the baseline thickness against another thickness of another cell, and generating equalization data if the difference in the baseline thickness and the another thickness exceeds a maximum thickness tolerance.

In another embodiment, a computer program product for enabling a computer to generate equalization data is described. In particular embodiments the computer program product enables a computer to perform the processes described above.

In yet another embodiment a design structure is provided for a multilayer electronic structure that comprises a dielectric layer having at least a displaced section of the dielectric layer having had material removed and a original section of the dielectric layer not having had material removed, and; a core layer having at least one signal trace thereupon; wherein when the dielectric is positioned versus the core layer the displaced section corresponds to a location of the core having at least one signal trace thereupon.

In yet another embodiment a design structure is provided for a multilayer electronic structure wherein the removed location corresponds to the location of the at least one signal trace after the dielectric layer is laminated to the core layer. In yet another embodiment a design structure is provided for a multilayer electronic structure wherein the amount of dielectric material removed is proportional to the volume of the at least one signal trace. In yet another embodiment a design structure is provided for a multilayer electronic structure wherein the amount of dielectric material removed is approximately equal to the volume of the at least one signal trace. In yet another embodiment a design structure is provided for a multilayer electronic structure wherein volume of the at least one signal trace at least in part relates to an optimum impedance. In yet another embodiment a design structure is provided for a multilayer electronic structure wherein the optimum impedance at least in part relates to signal trace geometry.

In yet another embodiment a design structure is provided for a multilayer electronic structure comprising a dielectric layer, a core layer having at least a first location with at least one signal trace thereupon, and a second location with no signal traces thereupon, and a characterized fill layer applied upon the second location. In yet another embodiment a design structure is provided for a multilayer electronic structure wherein the amount of characterized fill applied is inversely proportional to the volume of the at least one signal trace. In yet another embodiment a design structure is provided for a multilayer electronic structure wherein the amount of characterized fill applied is approximately equal to a volume equal to the area of the second group multiplied by the height of the at least one signal trace. In yet another embodiment a design structure is provided for a multilayer electronic structure wherein the amount of characterized fill applied is based on an optimum impedance. In yet another embodiment a design structure is provided for a multilayer electronic structure wherein the optimum impedance at least in part relates to via geometry.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 2A:
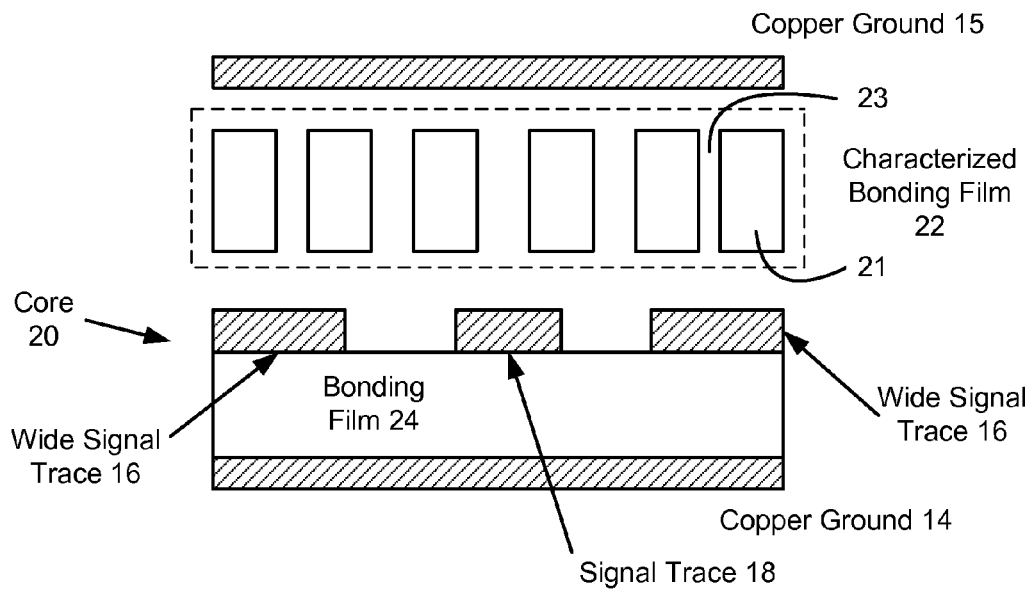
FIG. 2A depicts an exploded view of the components of a multilayer electronic structure, utilizing characterized boding film, according to an embodiment of the present invention.

Referring to the drawings, wherein like numbers denote like parts throughout the several views, please refer to FIG. 2A. FIG. 2A depicts an exploded multilayer electronic structure, according to an embodiment of the present invention. The exploded multilayer electronic structure comprises a first layer (e.g., core 20, etc.), a second layer (e.g., copper ground 15, etc.), and characterized bonding film 22 utilized to bond the first and second layers together. For example, characterized bonding film may bond two different core 20 layers together, or may bond a single core 20 layer with a copper ground 15 layer. Other layer types may be bonded together without deviation from the scope of the present invention. The copper ground 15 layer may itself be a layer, or may be the bottom of a second core 20.

Core 20 comprises a copper ground 14 (used as a reference ground layer), a layer of bonding film 24 (e.g., FR4, etc.), and a second layer of copper. Selected locations of the second layer of copper are removed (e.g., etched), leaving intact copper signal traces that provide for the internal circuitry of the multilayer electronic structure. In the embodiment shown by FIG. 2A, the second layer of copper is etched leaving a signal trace 18 nestled between two wide signal traces 16.

Characterized bonding film 22 comprises a sheet of bonding film 21 with displaced sections 23. Displaced sections 23 may be removed by various removal techniques or apparatus (drilling, etching, scraping, chemically, mechanically, laser, etc) without deviating from the scope of the present invention. The geometry of displaced sections 23 depend on the removal technique or apparatus utilized to remove the bonding film sections. The amount and location of the removal of sections 23 depend on the density and location of the various signal traces 18 upon core 20. The more signal traces 18 on core 20, the more displaced sections 23. In certain embodiments the volume of displaced sections 23 is approximately equal to the volume of removed copper (the remaining copper being the various signal traces). In yet other embodiments the displaced sections 23 are located such that when the characterized bonding film is bonded to core 20, the displaced sections 23 correspond the locations of the various signal traces (signal traces 16 and 18, etc). In certain embodiments, bonding film 21 and bonding film 24 are the same type of material; however the materials need not be similar.

Figure 1A:
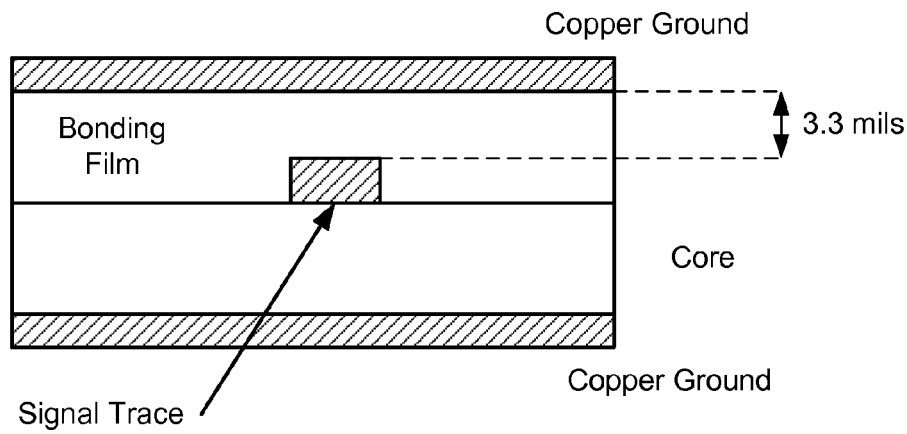
FIG. 1A depicts a prior art multilayer electronic structure section having a single isolated signal trace.
Figure 1B:
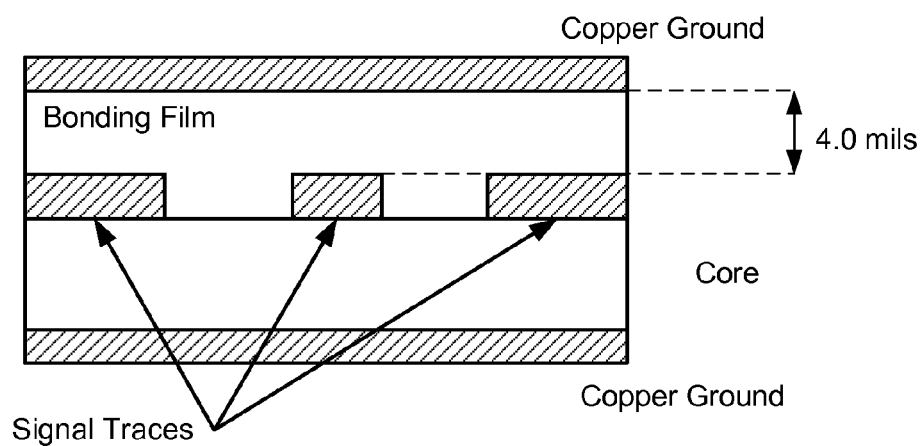
FIG. 1B depicts a prior art multilayer electronic structure section having a signal trace nestled between two wide signal traces.
Figure 2B:
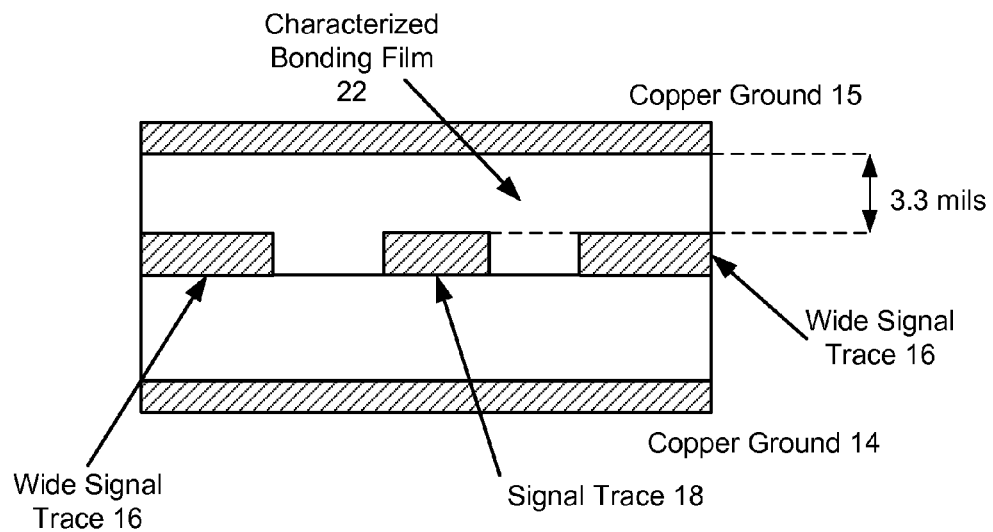
FIG. 2B depicts the multilayer electronic structure of FIG. 2A, after lamination, according to an embodiment of the present invention.

FIG. 2B depicts the multilayer electronic structure of FIG. 2A after lamination, according to an embodiment of the present invention. By utilizing characterized bonding film, the effect of the distance variations from the top of signal trace 18 to the adjacent reference ground layer (i.e., copper ground 15) is greatly reduced, if not eliminated. Please refer back to FIG. 1B, wherein a similar core configuration resulted in a distance (the distance from the top of the signal trace to the adjacent reference ground layer) of 4.0 mils as compared to a distance of 3.3 mils when utilizing the characterized bonding film 22.

By utilizing characterized bonding film 22, a designer may calculate a desired distance between the top of a signal trace to the adjacent reference ground layer or a desired impedance. Via size and signal trace density may be determined in order to provide the desired distance and/or impedance. The designer would then adjust the amount and location of displaced sections 23 accordingly, to achieve the desired distance/impedance.

The designer may also characterize the bonding film by removing a uniform thickness (or other geometry) from the bonding film in addition to the displaced sections 23 as described above.

Figure 2C:
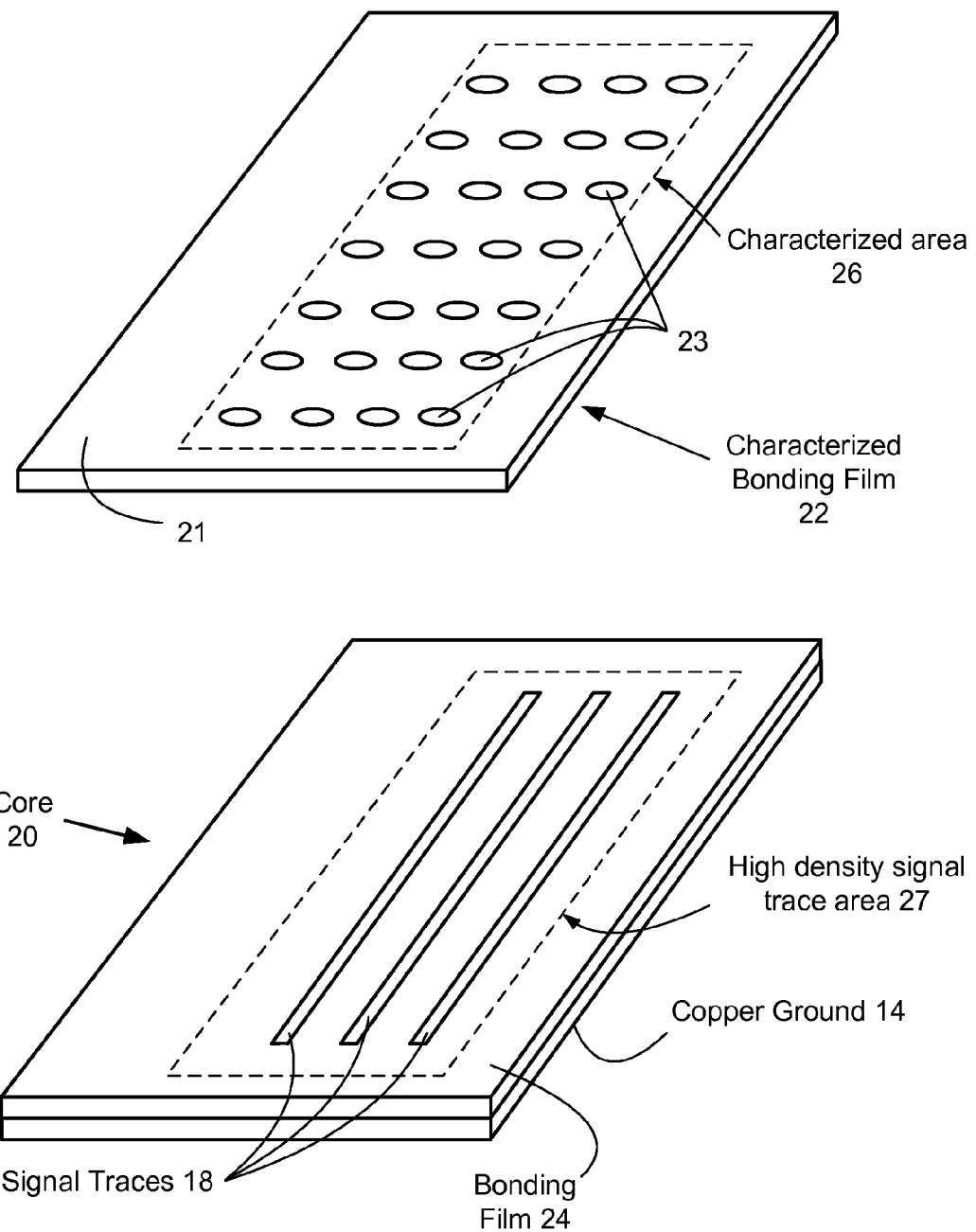
FIG. 2C depicts an isometric exploded view of a particular multilayer electronic structure utilizing characterized bonding film, according to an embodiment of the present invention.

Please refer to FIG. 2C. FIG. 2C depicts an exploded multilayer electronic structure, according to an embodiment of the present invention. Upon core 20, there comprises a high density signal trace area 27 at least having more signal traces 18 as compared to other locations upon core 20. Similarly, on characterized bonding film 22 there comprises a characterized area 26 at least having an increased number of displaced sections 23 as compared to other portions of bonding film 22. Characterized area 26 is arranged on characterized bonding film 22 such that when laminated to core 20, the characterized area 26 corresponds to high density signal trace area 27. In other words, there are more displaced sections 23 in higher dense signal trace areas.

Figure 2D:
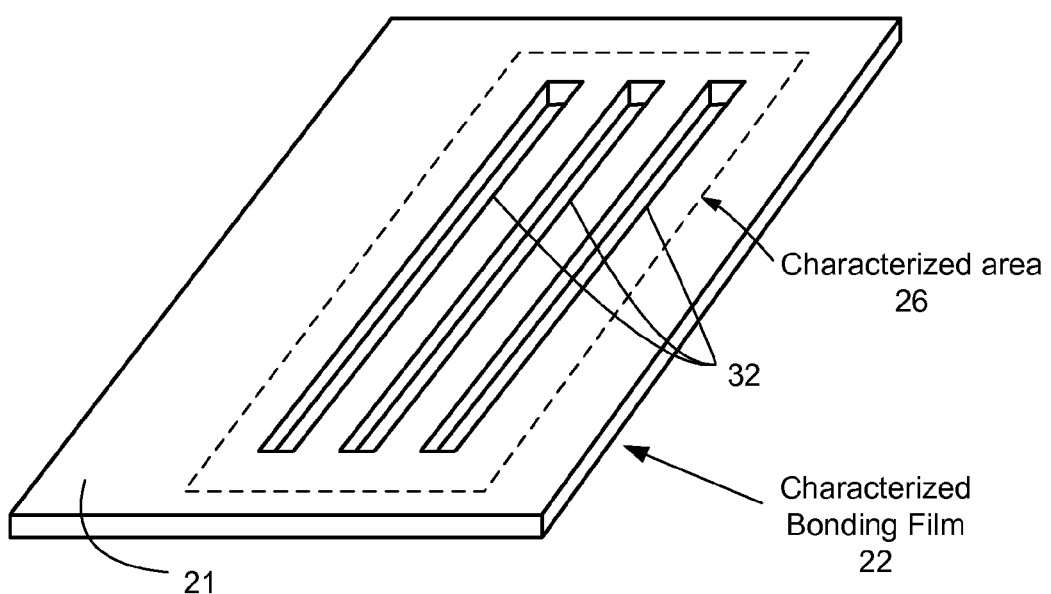
FIG. 2D depicts an isometric view of an alternative example of the displaced sections of characterized bonding film.

FIG. 2D depicts an alternative embodiment of characterized bonding film, having an alternative displaced section geometry, in accordance with the present invention. FIG. 2D shows characterized bonding film 22 having displaced sections 32 being rectangular; however in other embodiments displaced sections 32 are other geometries. Displaced sections 32 may be removed by various removal techniques or apparatus (drilling, etching, scraping, chemically, mechanically, laser, etc) without deviating from the scope of the present invention. The geometry of displaced sections 32 depend on the removal technique or apparatus utilized to remove bonding film mater.

Figure 3A:
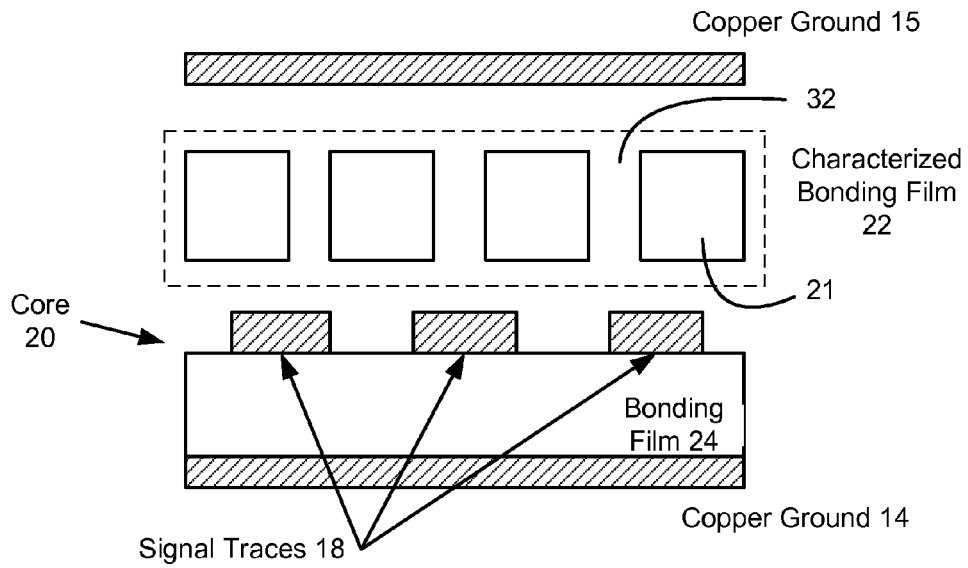
FIG. 3A depicts an exploded view of the components of a multilayer electronic structure, utilizing characterized boding film, according to an embodiment of the present invention.

FIG. 3A depicts an exploded multilayer electronic structure, according to an embodiment of the present invention. The exploded multilayer electronic structure comprises a first layer (e.g., core 20, etc.), a second layer (e.g., copper ground 15, etc.), and characterized bonding film 22 utilized to bond the first and second layers together. For example, characterized bonding film may bond two different core 20 layers together, or may bond a single core 20 layer with a copper ground 15 layer. Other layer types may be bonded together without deviation from the scope of the present invention. The copper ground 15 layer may itself be a layer, or may be the bottom of a second core 20.

Core 20 comprises a copper ground 14 (may be used as a reference ground layer), a layer of bonding film 24 (e.g., FR4, etc.), and a second layer of copper. Selected locations of the second layer of copper are removed (e.g., etched), leaving intact copper signal traces that provide for the internal circuitry of the electronic structure. In the embodiment shown by FIG. 3A, the second layer of copper is etched leaving signal traces 18.

Figure 1C:
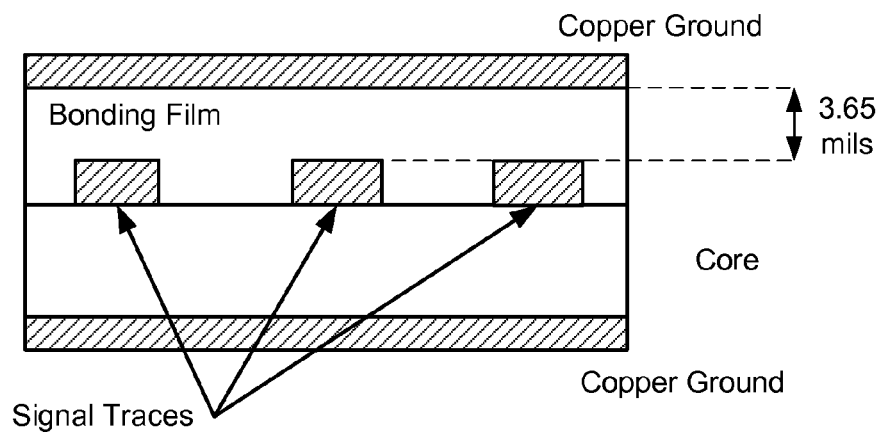
FIG. 1C depicts a prior art multilayer electronic structure section having a single trace nestled between two other signal traces.
Figure 3B:
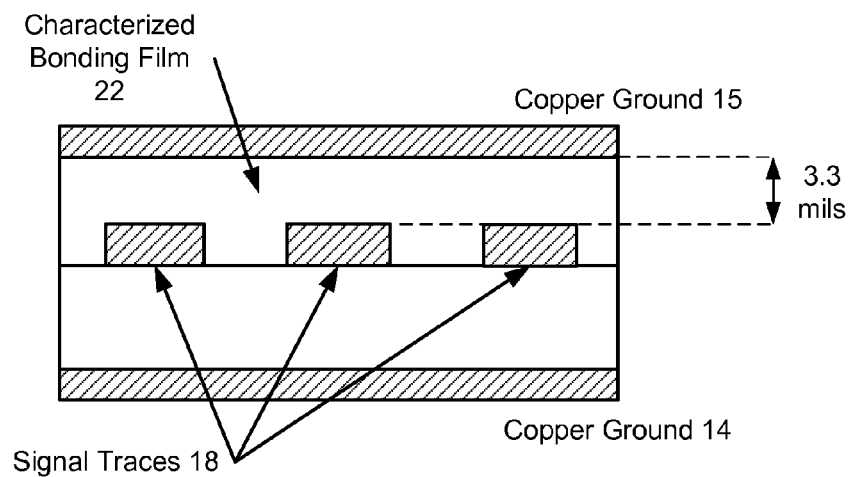
FIG. 3B depicts the multilayer electronic structure of FIG. 3A according to an embodiment of the present invention.

FIG. 3B depicts the multilayer electronic structure of FIG. 3A after lamination, according to an embodiment of the present invention. By utilizing characterized bonding film, the effect of the distance variations from the top of signal trace 18 to the adjacent reference ground layer (i.e., copper ground 15) is greatly reduced, if not eliminated. Please refer back to FIG. 1C, wherein a similar core configuration resulted in a distance (the distance from the top of the signal trace to the adjacent reference ground layer) of 3.65 mils as compared to a distance of 3.3 mils when utilizing the characterized bonding film 22.

By utilizing characterized bonding film 22 a constant distance from the top of the signal trace to the adjacent reference ground layer occurs in multiple signal trace configurations. This constant distance reduces the impedance tolerance across the multilayer electronic structure.

Figure 4A:
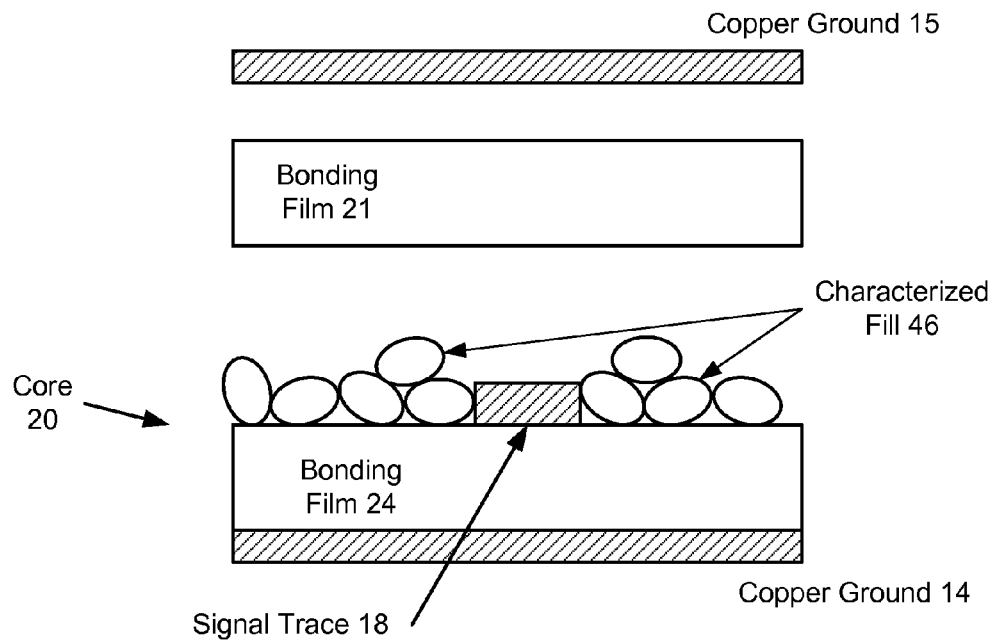
FIG. 4A depicts an exploded view of the components of a multilayer electronic structure, utilizing characterized fill, according to an embodiment of the present invention.

Please refer to FIG. 4A. FIG. 4A depicts an exploded view of the components of a multilayer electronic structure, utilizing characterized fill 46, according to an embodiment of the present invention. In an alternate embodiment to produce a uniform distance from the top of the signal trace to the adjacent reference ground layer, utilizes a dispersal apparatus (e.g., printer, sputter, spatter, etc.) to disperse upon core 20 characterized fill 46. Characterized fill 46 is dielectric material similar to bonding film 21 and/or 24. In certain embodiments characterized fill 46 may be partially cured epoxy. Characterized fill 46 is dispersed in a pattern that normalizes the distance variation from the top of bonding film 24 to the top of signal trace 18. In certain embodiments additional characterized fill 46 is dispersed to effectively bond the first layer to the second layer. In other words characterized fill 46 may replace bonding film 24.

In a particular embodiment, characterized fill 46 is made from the same material as bonding film 21 and/or 24, thus minimizing variations. In certain embodiments, characterized fill may be dispersed thermally, wherein small amounts of epoxy material are dispersed upon core 20 and thereby adhere to core 20. In this embodiment, the characterized fill may be cured/reflowed with the standard lamination process after dispersal.

In yet other embodiments, the dispersal pattern is 'inverse' of the density of the signal traces upon the core. As the density of signal traces increase, the amount of characterized fill 46 dispersed upon core 20 decreases. In certain embodiments, no characterized fill is dispersed in the highest dense signal trace location upon core 20. In certain other embodiments, the amount of characterized fill 46 dispersed is approximately equal to the amount (by volume, etc.) of copper that was etched away (thereby leaving the various signal traces).

Figure 5A:
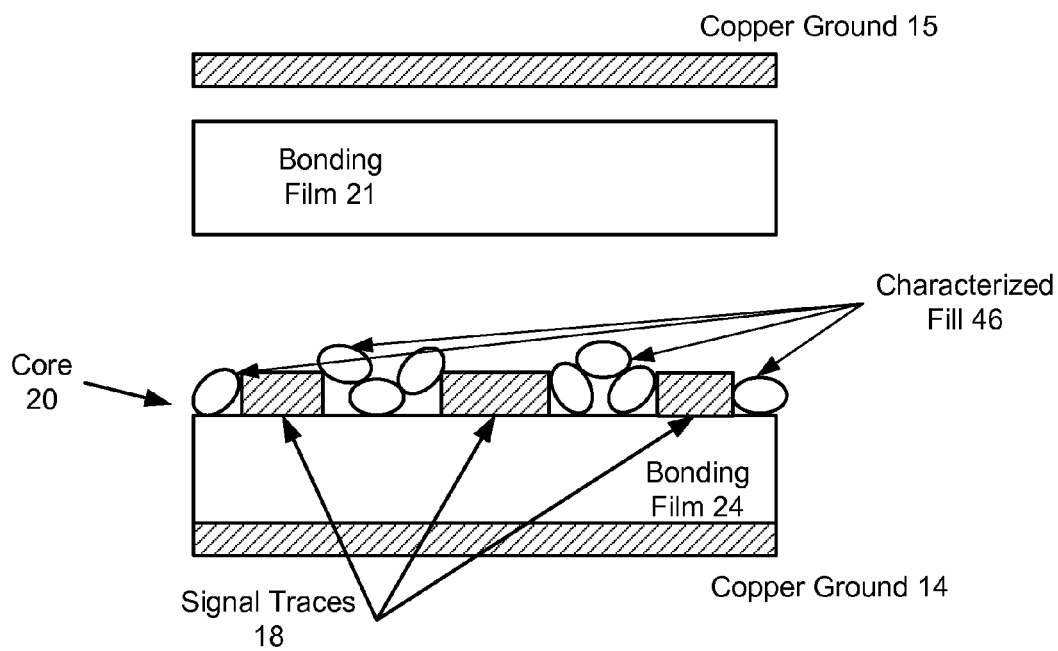
FIG. 5A depicts an exploded view of the components of a multilayer electronic structure, utilizing characterized fill, according to an embodiment of the present invention.
Figure 5B:
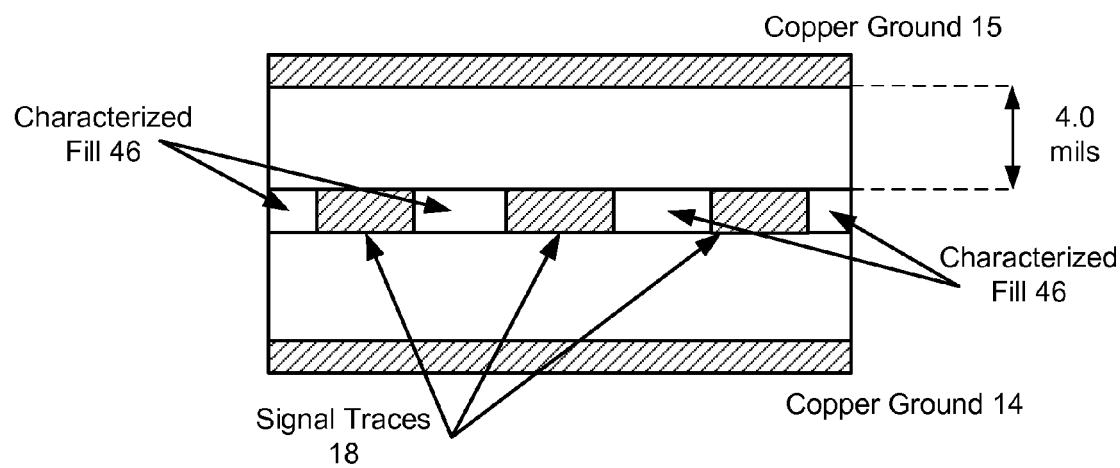
FIG. 5B depicts the multilayer electronic structure of FIG. 5A according to an embodiment of the present invention.
Figure 5C:
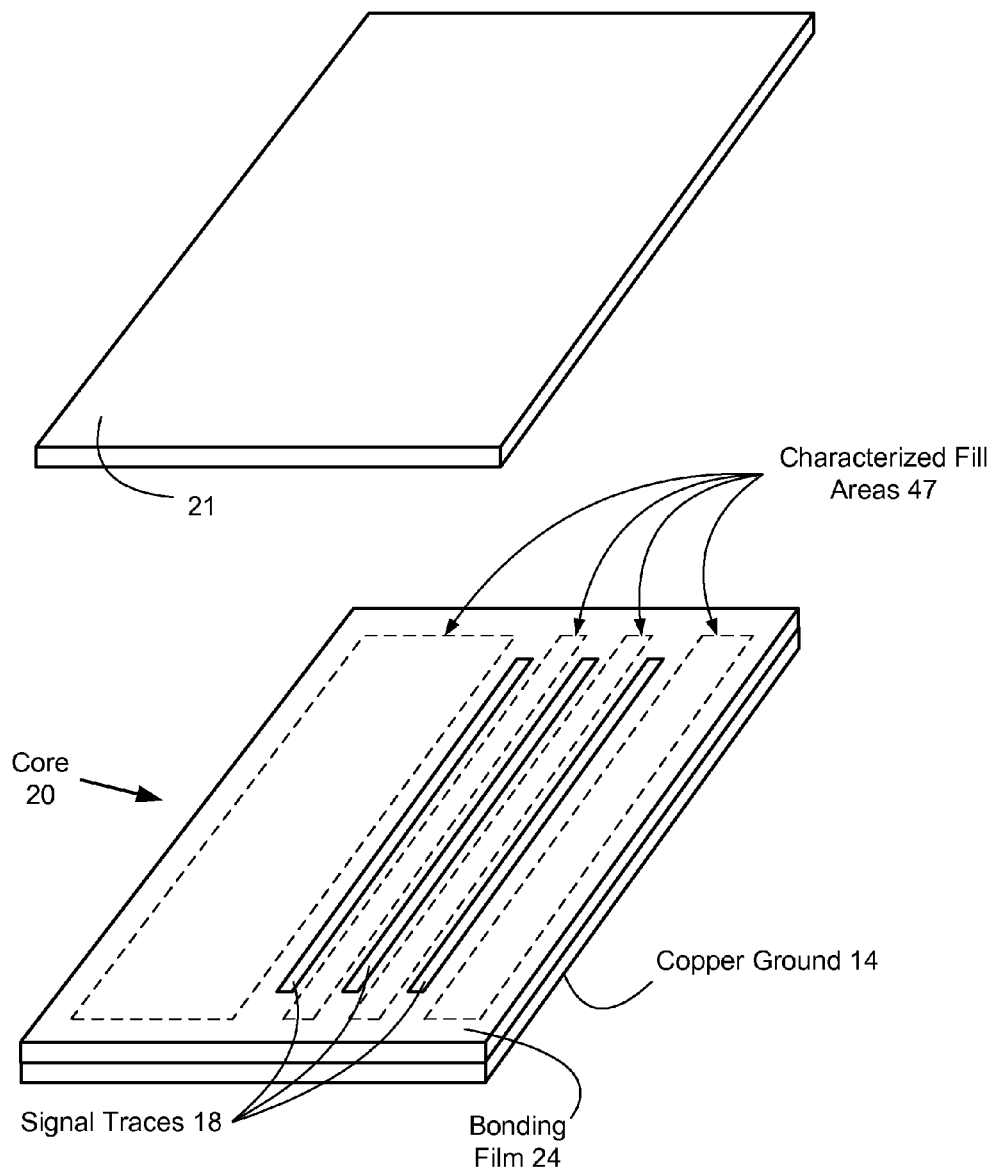
FIG. 5C depicts an isometric exploded view of various layers of a particular multilayer electronic structure.

In certain other embodiments, as shown in FIG. 5C, characterized fill 46 is only dispersed in characterized fill areas 47. Characterized fill areas 47 are locations upon core 20 that have a low density of signal traces. In another embodiment, characterized fill areas 47 are locations upon core 20 not having signal traces.

The amount and location of the characterized fill 46 depend on the density and location of the various signal traces 18 on core 20. The less signal traces 18 on core 20, the more characterized fill 46. In certain embodiments the volume of characterized fill 46 is approximately equal to the volume of removed copper (the remaining copper being the various signal traces).

By utilizing characterized fill 46, a designer may calculate a desired distance between the top of a signal trace to the adjacent reference ground layer or a desired impedance. Via size and signal trace density may be determined in order to provide the desired distance and/or impedance. The designer would then adjust the amount and location of dispersed characterized fill 46, to achieve the desired distance/impedance.

Figure 4B:
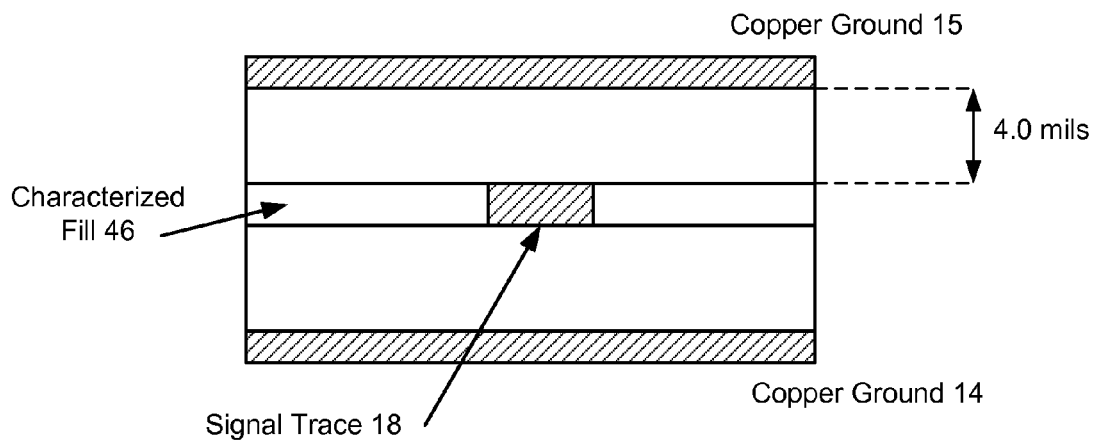
FIG. 4B depicts the multilayer electronic structure of FIG. 4A according to an embodiment of the present invention.

Please refer to FIG. 4B. FIG. 4B depicts the multilayer electronic structure of FIG. 4A after lamination, according to an embodiment of the present invention. By utilizing characterized film 46, the effect of the distance variations from the top of signal trace 18 to the adjacent reference ground layer (i.e., copper ground 15) is greatly reduced, if not eliminated.

Please refer back to FIG. 1A, wherein a similar core configuration resulted in a distance (the distance from the top of the signal trace to the adjacent reference ground layer) of 3.3 mils as compared to a distance of 4.0 mils when utilizing the characterized bonding film 22.

Please refer to FIG. 5A. FIG. 5A depicts an exploded multilayer electronic structure, according to an embodiment of the present invention. The exploded multilayer electronic structure comprises a first layer, a second layer, characterized fill 46, and bonding film utilized to bond the first and second layers together. Characterized fill 46 is dispersed, as described above, in the spaces not filled by signal traces 18.

FIG. 5B depicts the multilayer electronic structure of FIG. 3A after lamination, according to an embodiment of the present invention. By utilizing characterized fill 46, the effect of the distance variations from the top of signal trace 18 to the adjacent reference ground layer (i.e., copper ground 15) is greatly reduced, if not eliminated. Please refer back to FIG. 1C, wherein the similar core configuration resulted in a distance (the distance from the top of the signal trace to the adjacent reference ground layer) of 3.65 mils as compared to a distance of 4.0 mils when utilizing the characterized fill 46.

By utilizing characterized fill 46 a constant distance from the top of the signal trace to the adjacent reference ground layer occurs in multiple signal trace configurations. This constant distance reduces the impedance tolerance across the multilayer electronic structure.

Figure 6:
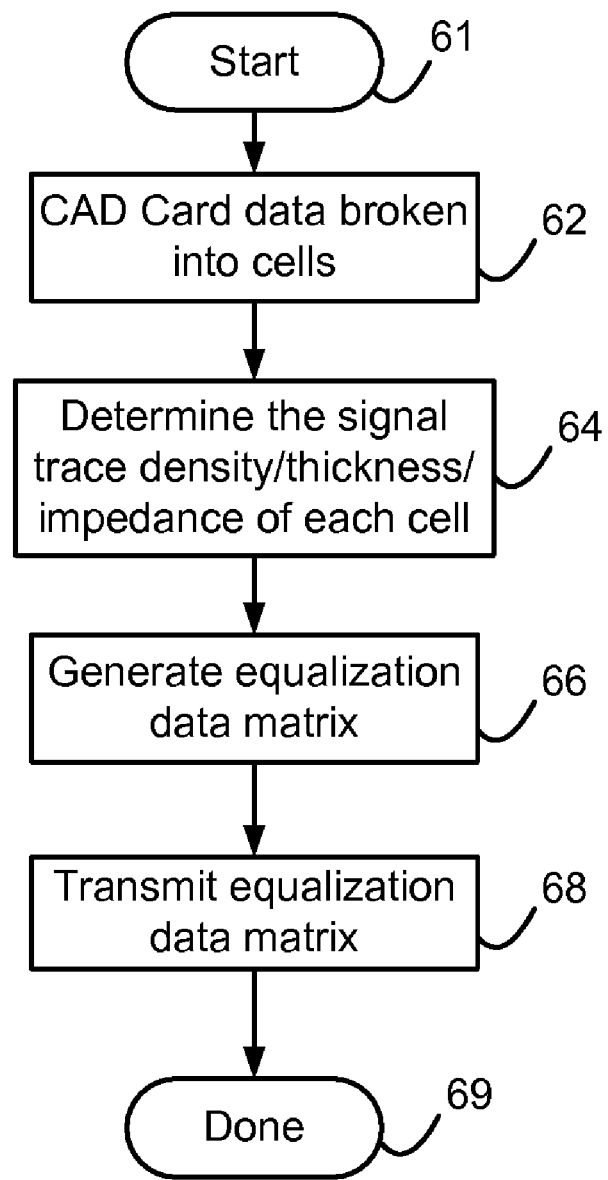
FIG. 6 depicts a process of generating equalization data used to equalize thickness and/or impedance tolerances in multilayer electronic structures, according to an embodiment of the present invention.

Please refer to FIG. 6. FIG. 6 depicts a process 60 of generating equalization data utilized to equalize thickness and/or impedance variations across a multilayer electronic structure, according to an embodiment of the present invention. Process 60 begins at block 61. In order to determine the geometrical and manufacturing properties (quantity, location, etc.) of characterized fill 46, and/or alternatively characterized bonding film 22, equalization data is created. Equalization data is utilized to equalize thickness and/or impedance variations across a multilayer electronic structure. Equalization data represents the data associated with characterized bonding film 22 (i.e., the locations of displaced sections 23, etc.) or data associated with characterized fill 46 (i.e., the locations of where to disperse, etc). An equalization data matrix is the equalization data of at least two locations of the multilayer electronic structure. In an alternative embodiment, the equalization data matrix is the equalization data of the entire multilayer electronic structure. Creating equalization data may be dependent on determining the signal trace density of a particular area (block 64) of the multilayer electronic structure. In other embodiments, discussed infra, equalization data may be dependent on determining circuit board layer(s) thickness/impedance (block 64). The particular location of the printed circuit card considered is referred to as a cell. The cell may be a two dimensional area or a three dimensional volume. The area/volume of the cell is adjustable, however the smaller the area/volume of a cell, better equalization data may be created. When a generation of cells (block 62) in/from/to the computer aided design (CAD) data of the multilayer electronic structure occurs, equalization data may be created for each cell. When there is more than one cell, the equalization data matrix is created (block 66). Once generated, the equalization data, or equalization data matrix, may be transferred (block 68), for example to a card manufacturer. Process 60 ends at block 69.

Figure 7A:
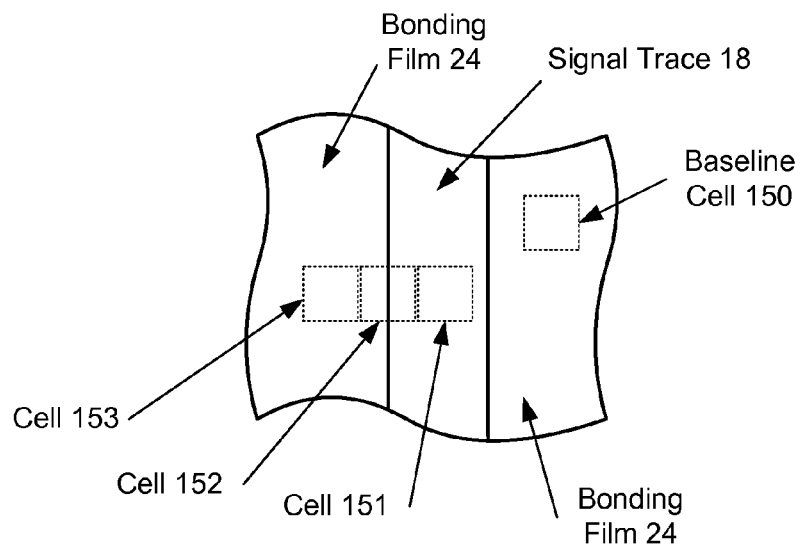
FIG. 7A depicts a top view of a section of a multilayer electronic structure having a signal trace thereupon wherein cells are utilized to determine the signal trace density.
Figure 8:
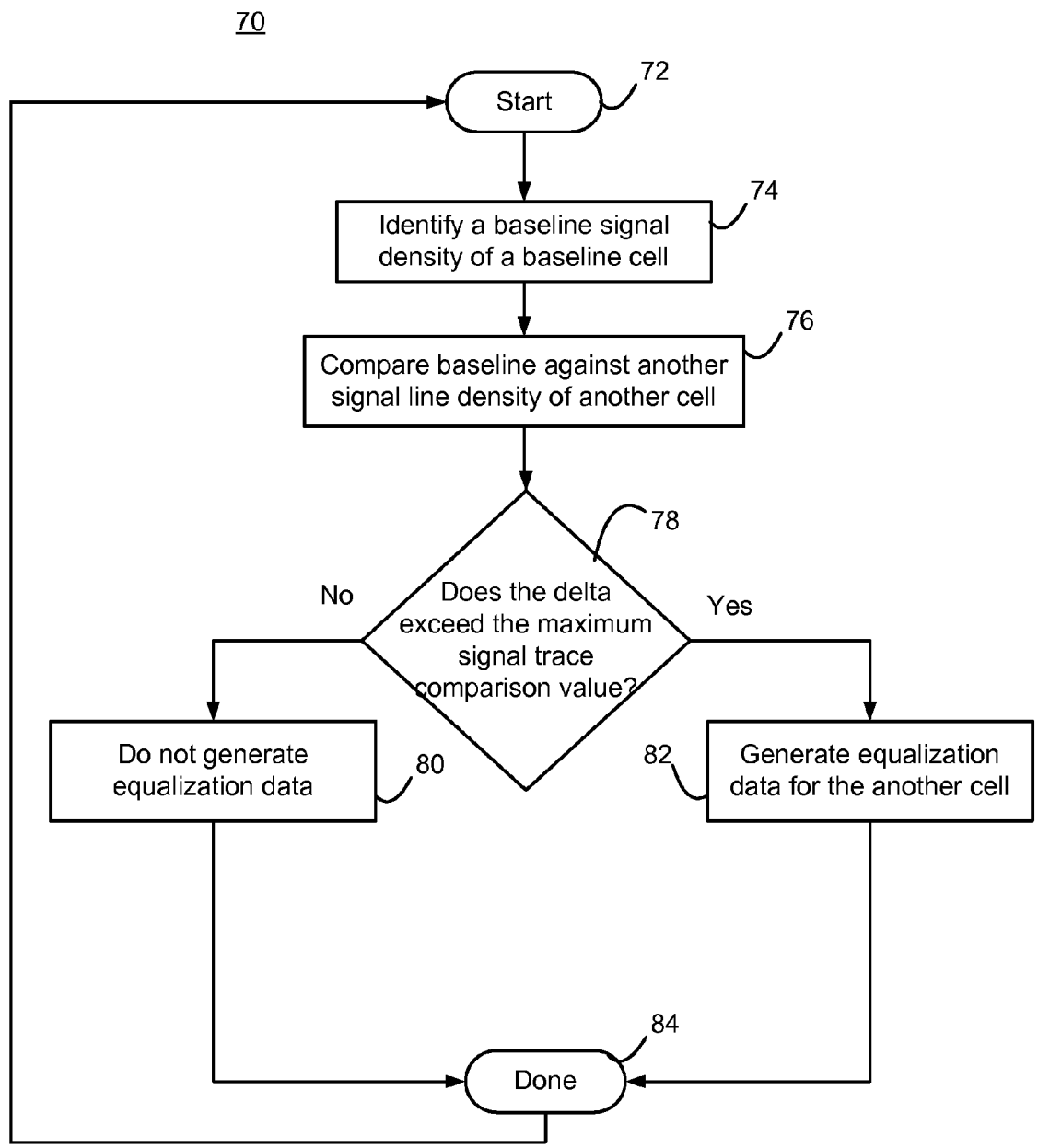
FIG. 8 depicts a process of generating equalization data utilizing the signal trace density of particular layers of multilayer electronic structure, according to an embodiment of the present invention.

Please refer to FIG. 7A and FIG. 8 concurrently. FIG. 7A depicts a top view of a multilayer electronic structure layer having a signal trace thereupon, further depicting a baseline cell 150, and cells 151-153. FIG. 8 depicts another process 70 of determining the signal trace density of each cell and the generating equalization data, according to an embodiment of the present invention. Process 70 starts at block 72. Upon generating of cells in/from/to the CAD data (block 62 shown in FIG. 6), a baseline cell 150 is identified (block 74). The baseline cell 150 has a corresponding baseline signal trace density (for instance the percentage of the cell filled by the signal traces). In a particular embodiment, shown in FIG. 7A, the baseline cell 150 is a cell having no signal trace(s) within. In another embodiment, the baseline cell is completely filled by a signal trace. In other embodiments the baseline cell may have any percentage of the cell encapsulating a signal trace, however it is preferable that the baseline entirely encapsulates a signal trace, or does not encapsulate any signal trace. The base line cell 150 (and/or baseline cell signal trace density) is compared to another cell (and/or another cell signal trace density) (block 76). If the delta exceeds a maximum signal trace comparison value (block 78), equalization data is generated for the another cell (block 82). Take for example, FIG. 7A. The baseline cell 150 encapsulates no signal trace(s), cell 153 also encapsulates no signal trace(s), cell 152 is 50% filled by a signal trace and 50% not filled by a signal trace, and finally cell 151 entirely encapsulates a signal trace(s). A preset maximum comparison signal trace density value (block 78) is set, for example at 0.10, meaning that equalization data is generated for the another cell if the another cell has a signal trace density of greater than 10% of the baseline cell. The maximum preset comparison signal trace density value may be adjustable by a user. Cell 152 (50% filled, 50% not filled) has a signal trace density of 0.5 because it is half filled by a signal trace. Cell 153 has a signal trace density of 0.0 because it does not encapsulate a signal trace. Cell 151 has a signal trace density of 1.0 because it does entirely encapsulate a signal trace. Because 1.0 and 0.5, respectively exceeds the maximum comparison signal trace density value of 0.1, equalization data is generated for cell 152 and 151 (block 82). If however the actual signal trace density value does not exceed the preset maximum signal trace density value of 0.1, such as cell 153's value of 0.0, equalization data is not generated for cell 153 (block 80). In another embodiment equalization data is generated for cell 153 indicating that no characterization shall occur in the location of the characterized bonding film in the corresponding location. Process 70 ends at block 84.

In a particular embodiment equalization data is generated for use relating to characterized bonding film 22 utilizing the cell structure exemplified in FIG. 7A. In this particular embodiment the equalization data indicates the locations and quantity of material to be removed from bonding film 21. Please continue the example from above (i.e., baseline cell 150 encapsulates no signal trace(s), cell 153 also encapsulates no signal trace(s), cell 152 is 50% filled by a signal trace and 50% not filled by a signal trace, and finally cell 151 entirely encapsulates a signal trace(s)). Signal trace properties are determined or are known (i.e., height and width, etc.). The area of each cell is known or is determined. Each cell is analyzed whereby it is determined that 50% of the cell 152 is filled by a signal trace(s). Assume each cell's area is 0.5 mil square, and the thickness of the signal trace 18 is 1.4 mils. Therefore, 0.25 mil square of cell 152 is filled by the signal trace 18, (50% of the cell area). Thus, 0.25 mil square×the signal trace 18 height (1.4 mils)=0.35 cubic mils. This volume therefore is the approximate volume that needs to be removed from bonding film 21 in the particular location that corresponds with cell 152. Again the location corresponds if after lamination the particular location of the printed circuit card layer (where the particular cell was located) is laminated with the bonding film that has the particular displaced section.

Any such volume approximately being 0.35 cubic mils may be removed from the bonding film in the corresponding location (i.e., the geometry of the displaced section may be any such geometry without departing from the scope of the present invention).

In another embodiment equalization data is generated for use relating to characterized fill 46 utilizing the cell structure exemplified in FIG. 7A. In this particular embodiment the equalization data indicates the locations and quantity of characterized fill to be added upon core 20. Please continue the example from above (i.e., baseline cell 150 encapsulates no signal trace(s), cell 153 also encapsulates no signal trace(s), cell 152 is 50% filled by a signal trace and 50% not filled by a signal trace, and finally cell 152 entirely encapsulates a signal trace(s)). Signal trace properties are determined or are known (i.e., height and width, etc.). The area of each cell is known or is determined. Each cell is analyzed whereby it is determined that 50% of the cell 152 is filled by a signal trace(s). Assume each cell's area is 0.5 mil square, and the thickness of the signal trace 18 is 1.4 mils. Therefore, 0.25 mil square of cell 152 is filled by the signal trace 18, (50% of the cell area). Thus, 0.25 mil square×the signal trace 18 height (1.4 mils)=0.35 cubic mils. This volume therefore is the approximate volume of characterized fill 46 that is added upon core 20 in the particular location that corresponds with cell 152. No characterized fill 46 would be added upon core 20 in the location corresponding to cell 151. 0.7 cubic mills (0.5 square mills*1.4 mills) is the approximate volume of characterized fill 46 that would be added upon core 20 in the location corresponding cell 153. Again the location "corresponds" if after lamination the particular location of the printed circuit card layer (where the particular cell was located) is laminated with the bonding film that has the particular displaced section. The geometry of the characterized fill 46 may be any such geometry without departing from the scope of the present invention.

Figure 7B:
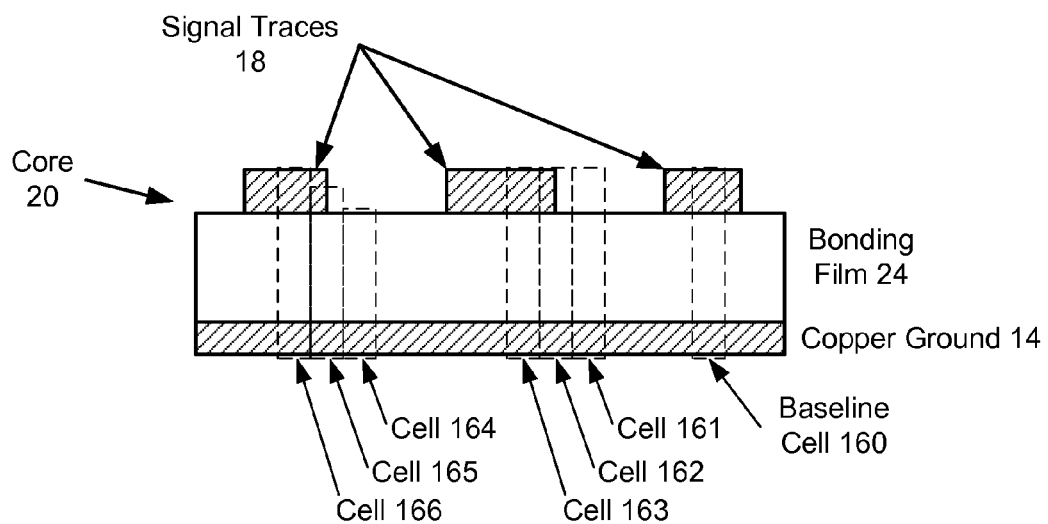
FIG. 7B depicts a side view a section of a multilayer electronic structure having three signal traces thereupon wherein cells are utilized to determine thickness and/or impedance.
Figure 9:
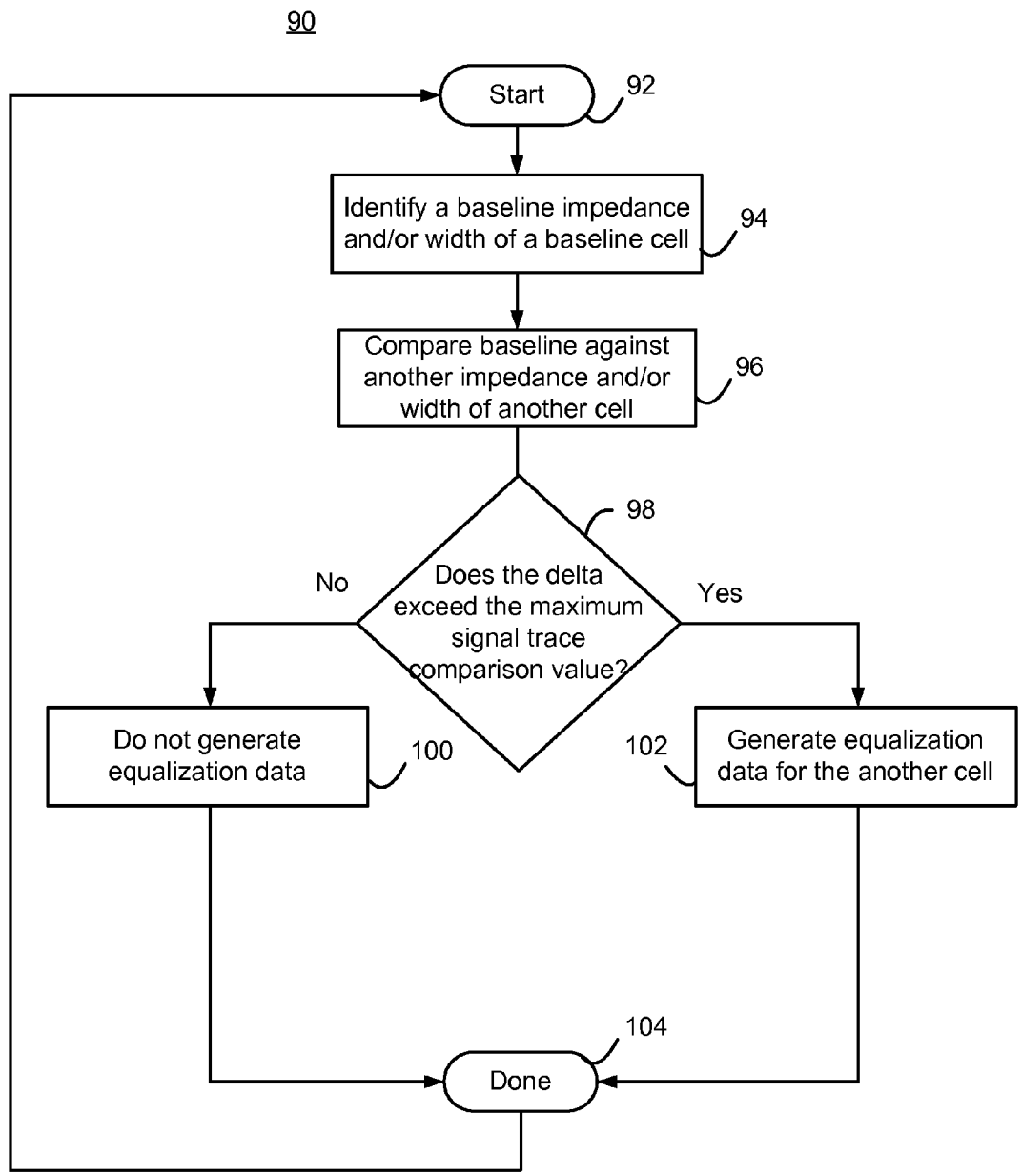
FIG. 9 depicts a process of generating equalization data utilizing the thickness/impedance of a particular layer(s) of a multilayer electronic structure, according to an embodiment of the present invention.

Please refer to FIG. 7B and FIG. 9 concurrently. FIG. 7B depicts a side view of a multilayer electronic structure core 20 having signal traces 18 thereupon, further depicting baseline cell 160, and cells 161-163. FIG. 9 depicts yet another alternative process of determining the signal trace impedance/width of each cell and generating equalization data, according to an embodiment of the present invention. Process 90 starts at block 92. Upon generating cells in/from/to the CAD data (block 62, shown in FIG. 6), a baseline cell 160 is identified (block 94). The cells (baseline and others), as contemplated in utilizing process 90, are three dimensional volumes. The baseline cell 160 encapsulates a section of the at least one CAD circuit card layer. Therefore the baseline cell 160 has a particular first dimension, second dimension, and a third dimension that corresponds to the thickness of the at least one CAD circuit card layer. In a particular embodiment, the baseline cell is a cell encapsulating a section of core 20 and no signal trace(s) (not shown). In another embodiment the base line cell 160 encapsulates a section of core 20 and a signal trace (as shown in FIG. 7B). It may be preferred to create the baseline cell 160 such that the cell has the largest volume possible without empty space above and below the particular circuit board layer(s). In another embodiment the other cell (i.e., cells 161-163) volume equals the volume of baseline cell 160. In other embodiments the volumes of the other cells do not equal the volume of the baseline cell. Further, the volume of cell 161 for instance, may not equal the volume of cell 162. For example because there is empty space in cell 161, cell 161 may be shortened such that the height would be similar to the height of the copper ground 14 and bonding film 24 stack. In another embodiment in an instance where there is empty space in a cell (i.e., cell 161 and 162) the height of those cells are shortened by a distance similar to the distance of the signal trace 18 height.

Baseline cell 160 has a baseline thickness/impedance. The baseline cell 160 thickness/impedance is compared to another cell's (cell 161-163) thickness/impedance (block 96). If the delta exceeds a maximum signal trace comparison value (block 98), equalization data is generated for the another cell (block 102). In a new example, the baseline cell 160 encapsulates the at least one layer of a printed circuit card (e.g., copper ground 14 and bonding film 24) and at least part of a signal trace 18. In the present embodiment, as shown in FIG. 7B, the dimension of cells 161-163 are set similarly to the dimensions of the baseline cell 160, however as indicated above the volumes of each cell need not be similar. Cell 163 similarly encapsulates the at least one layer of a printed circuit card and at least part of a signal trace 18. Cell 162 encapsulates the at least one layer of a printed circuit card and at least part of a signal trace 18, but also encapsulates empty space (i.e., space without a section of signal trace 18). Cell 161 encapsulates the at least one layer of a printed circuit card and does not encapsulate at least part of a signal trace 18 (i.e., cell 161 has more empty space than 162). Thus cells 161-163 demonstrate the transition from a location of a multilayer electronic structure layer going from at least one layer without a signal trace there upon (cell 161), to a location where part of the cell encapsulates a signal trace and part of the cell does not (cell 162), to a location of a layer with a signal trace there upon (cell 163).

A preset maximum comparison impedance/thickness value (block 98) is generated, meaning that equalization data is generated (block 102) for the another cell if the another cell has thickness/impedance greater than the baseline cell. The maximum preset comparison value may be adjustable. If however the actual impedance/thickness value does not exceed the preset maximum comparison value, equalization data is not generated for the another cell (block 100). Process 90 ends at block 104.

In a particular embodiment equalization data is generated for use relating to characterized bonding film 22, utilizing the cell structure exemplified in FIG. 7B. In this particular embodiment the equalization data indicates the locations and quantity of material to be removed from bonding film 21 (thereby creating characterized bonding film). Please consider the example depicted in FIG. 7B. Cells may be generated in multiple configurations, two such configurations are depicted in FIG. 7B. Cells 161-163 depict cells of similar geometries, and cells 164-166 depict cells of varying geometries. The volume of each cell is known or is determined. Equalization data is created for each cell.

For example cell 164 is compared with cell 166. The volume differential of cell 166 and 164 would represent the equalization data for cell 166. The impedance/height of the cells may also be translated into a volume. This volume differential would be the volume of material that is to be removed from characterized bonding film 22 in the location that corresponds to cell 166.

In another embodiment equalization data is generated for use relating to characterized fill 46, utilizing the cell structure exemplified in FIG. 7B. In this particular embodiment the equalization data indicates the locations and quantity of characterized fill to be added upon core 20. For example cell 164 is compared with cell 166. The volume differential of cell 166 and 164 would represent the equalization data for cell 164. The impedance/height of the cells may also be translated into a volume. This volume differential would be the volume of material that is to be added upon core 20 in the location that corresponds to cell 164.

Figure 10:
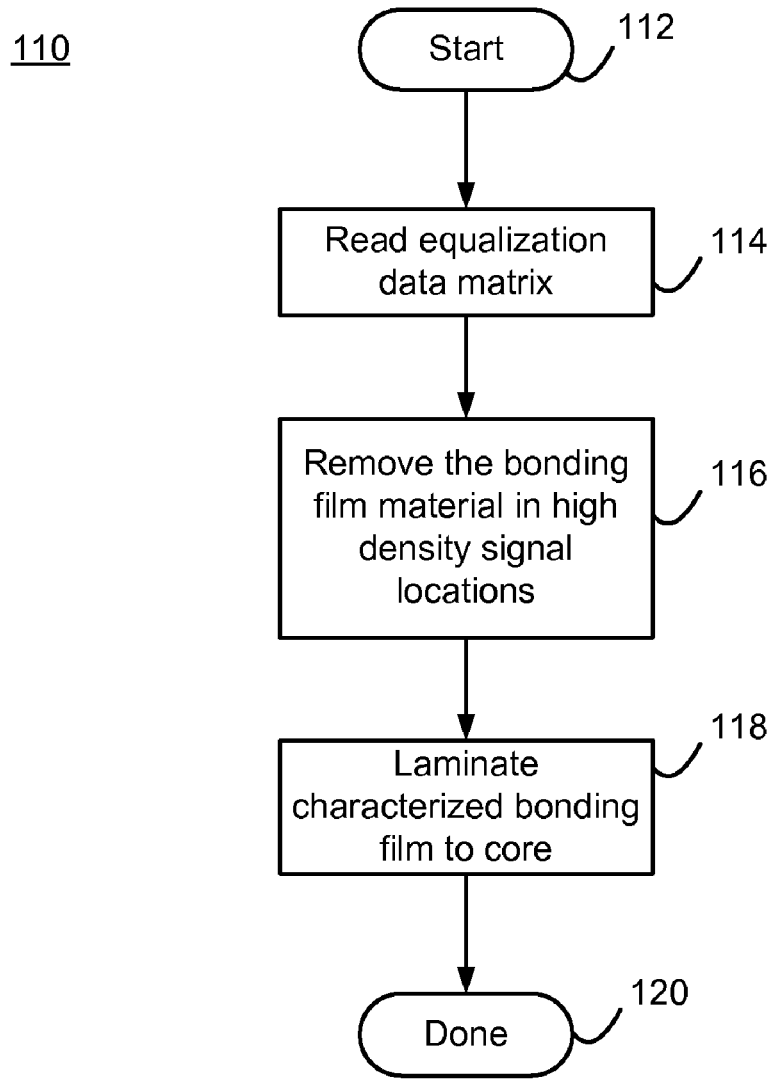
FIG. 10 depicts a method of multilayer electronic structure manufacture according to an embodiment of the present invention.

FIG. 10 depicts a method of multilayer electronic structure manufacture according to an embodiment of the present invention. Method 110 begins at block 112 and may be practiced, for example, by a card manufacturer. The equalization data matrix is read (block 114) to determine the particular locations to be removed from a sheet of bonding film, thus creating characterized bonding film 22. The particular areas of the bonding film that will correspond to high signal trace density after lamination are removed (block 116) thereby creating characterized bonding film 22. The characterized bonding film 22 is then laminated (block 118) to the core such that the characterized area 26 corresponds to the high density signal trace area 27. Method 110 ends at block 120.

Figure 11:
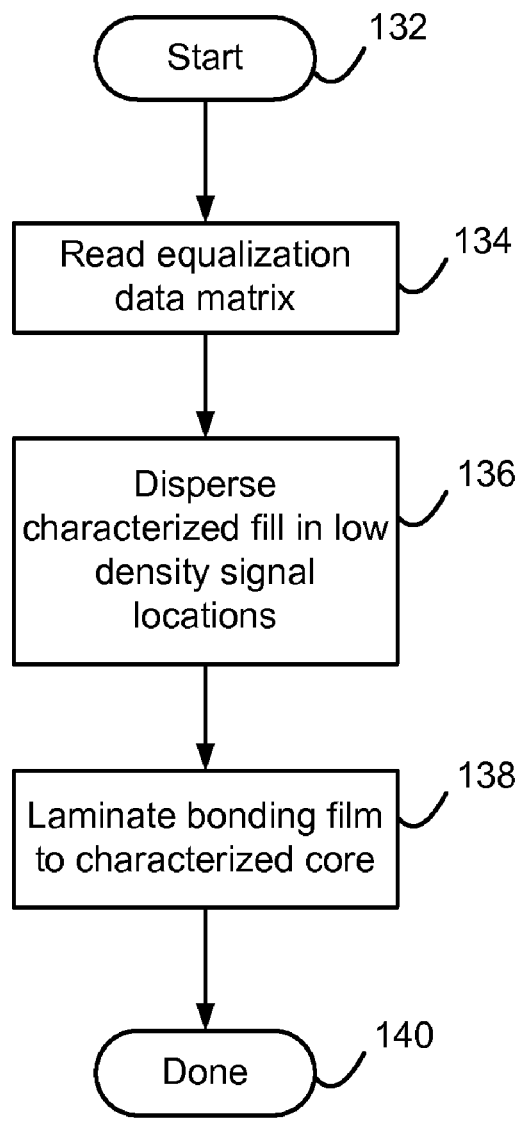
FIG. 11 depicts an alternative method of multilayer electronic structure manufacture according to an embodiment of the present invention.

FIG. 11 depicts an alternative method of multilayer electronic structure manufacture according to an embodiment of the present invention. Method 130 begins at block 132 and may also be practiced, for example, by a card manufacturer. The equalization data matrix is read (block 134) to determine the particular areas upon core 20 that characterized fill 46 are to be added. Characterized fill is dispersed (block 136) upon core 20 in characterized fill areas 47. Bonding film is then laminated (block 138) to the characterized core (core 20 having characterized fill 46 thereupon). Method 130 ends at block 140.

Figure 12:
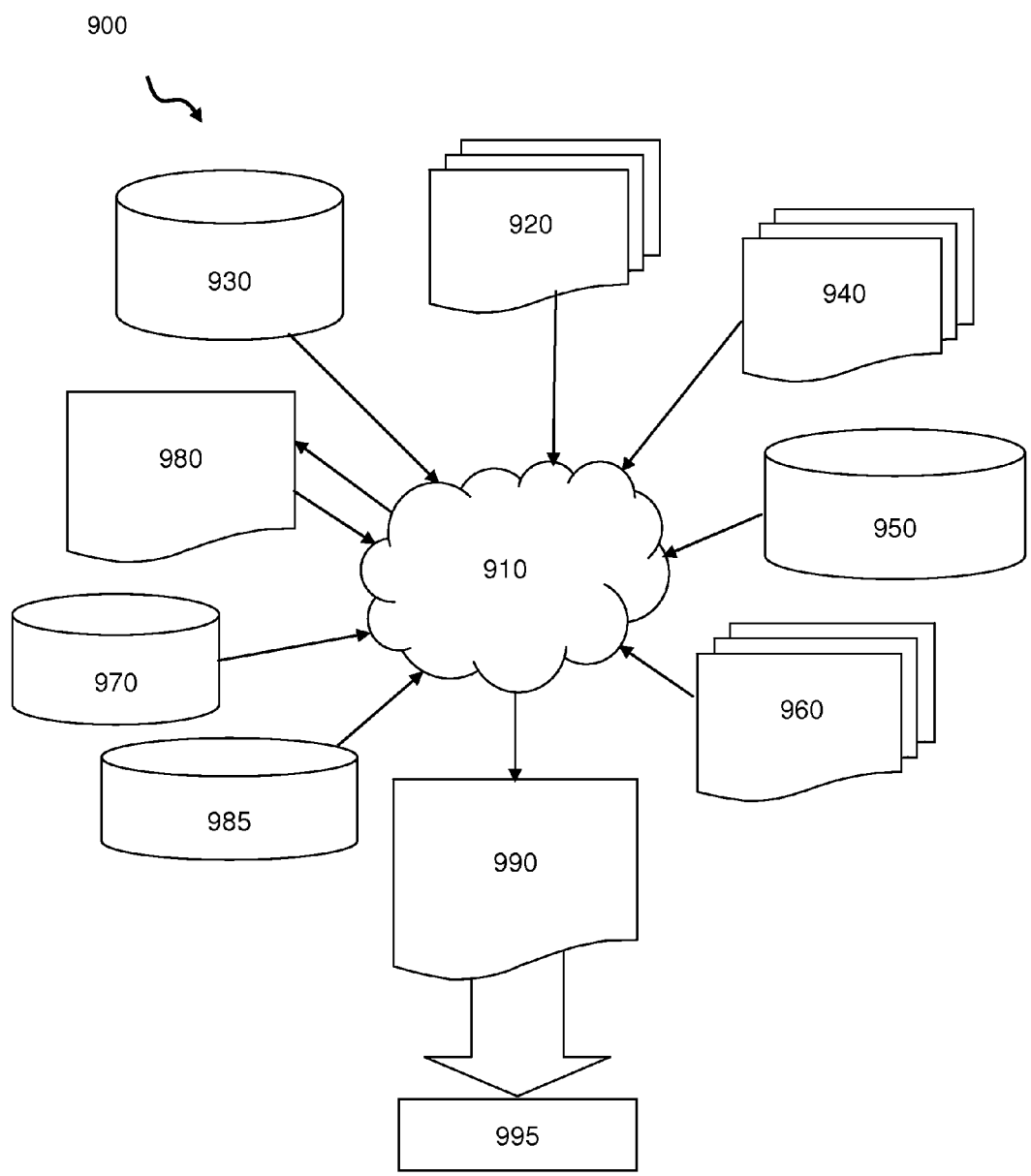
FIG. 12 is a flow diagram of a design process used in multilayer electronic structure design, manufacturing, and/or test according to an embodiment of the present invention.

FIG. 12 shows a block diagram of an exemplary design flow 900 used for example, in multilayer electronic system design, simulation, test, layout, or manufacture. Design flow 900 includes processes and mechanisms for processing design structures to generate logically or otherwise functionally equivalent representations of the embodiments of the invention shown in FIGS. 2A, 2B, 2C, 2D, 3A, 3B, 4A, 4B, 5A, 5B, 5C, 7A, and/or 7B. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a developer/designer. When encoded on a machine-readable data transmission or storage medium, design structure 920 may be accessed and processed by one or more hardware and/or software modules within design process 910 to simulate or otherwise functionally represent an electronic component, mechanical component, circuit, electronic or logic module, apparatus, device, or system such as those shown in FIGS. 2A, 2B, 2C, 2D, 3A, 3B, 4A, 4B, 5A, 5B, 5C, 7A, and/or 7B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2A, 2B, 2C, 2D, 3A, 3B, 4A, 4B, 5A, 5B, 5C, 7A, and/or 7B to generate a netlist 980 which may contain design structures such as design structure 920. Netlist 980 may comprise, for example, compiled or otherwise processed data structures representing other elements in multilayer electronic structure design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, structures, and devices, including models, layouts, and symbolic representations, for a given manufacturing technology. The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2A, 2B, 2C, 2D, 3A, 3B, 4A, 4B, 5A, 5B, 5C, 7A, and/or 7B. In one embodiment, design structure 990 may comprise a compiled, executable simulation model that functionally simulates the devices shown in FIGS. 2A, 2B, 2C, 2D, 3A, 3B, 4A, 4B, 5A, 5B, 5C, 7A, and/or 7B.

Design structure 990 may also employ a data format used for the exchange of layout data of multilayered electronic structure and/or symbolic data format (e.g., information stored in a Cadence, Gerber, GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2A, 2B, 2C, 2D, 3A, 3B, 4A, 4B, 5A, 5B, 5C, 7A, and/or 7B. Design structure 990 may then proceed to a stage 995 where, for example, design structure 990: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The invention claimed is:

1. A process of providing equalization data comprising:
allowing for the design of a multilayer electronic structure on a computer aided design package;
generating finite element cells upon at least one layer of the multilayer electronic structure;
calculating signal trace densities utilizing the generated finite element cells;
generating equalization data, utilizing the calculated signal trace densities for equalizing the multilayer electronic structure thickness or impedance
assembling the equalization data into an equalization data matrix for the multilayer electronic structure, and;
providing the equalization data matrix for the multilayer electronic structure for use within the computer aided design package.

2. The process of claim 1 further comprising:
providing the equalization data matrix to aid in the manufacturing of the multilayer electronic structure.

3. The process of claim 1 wherein generating equalization data further comprises:
identifying a baseline finite element cell having a baseline signal trace density;
comparing the baseline signal trace density against another signal trace density of an another cell;
generating equalization data if the difference in the baseline signal trace density and the another signal trace density exceeds a maximum signal trace density value.

4. The process of claim 3 wherein the equalization data provides the location and the amount of bonding film material to be removed.

5. The process of claim 3 wherein the equalization data provides the location and the amount of characterized fill to be added upon a layer of the multilayer electronic structure having signal traces thereupon.

6. The process of claim 1 wherein generating equalization data further comprises:
identifying a baseline finite element cell having a baseline impedance;
comparing the baseline impedance against an another impedance of an another cell;
generating equalization data if the difference in the baseline impedance and the another impedance exceeds a maximum impedance.

7. The process of claim 6 wherein the equalization data provides the location and the amount of dielectric material to be removed.

8. The process of claim 6 wherein the equalization data provides the location and the amount of characterized fill to be added upon a layer of the multilayer electronic structure having signal traces thereupon.

9. The process of claim 1 wherein generating equalization data further comprises:
identifying a baseline finite element cell having a baseline thickness;
comparing the baseline thickness against another thickness of an another cell;
generating equalization data if the difference in the baseline thickness and the another thickness exceeds a maximum thickness tolerance.

10. The process of claim 9 wherein the equalization data provides the location and the amount of dielectric material to be removed.

11. The process of claim 9 wherein the equalization data provides the location and the amount of characterized fill to be added.

* * * * *